United States Patent [19]

Sadaie

[11] Patent Number: 5,033,092

[45] Date of Patent: Jul. 16, 1991

[54] STEREOPHONIC REPRODUCTION SYSTEM

[75] Inventor: Koichi Sadaie, Neyagawa, Japan

[73] Assignee: Onkyo Kabushiki Kaisha, Osaka, Japan

[21] Appl. No.: 416,670

[22] Filed: Oct. 3, 1989

[30] Foreign Application Priority Data

Dec. 7, 1988 [JP] Japan ................................ 63-310777

[51] Int. Cl.[5] ............................................ H03G 00/00

[52] U.S. Cl. ......................................... 381/97; 381/86; 381/24

[58] Field of Search .......................... 381/86, 24, 97, 1

[56] References Cited

U.S. PATENT DOCUMENTS 4,218,585 8/1980 Carver ................................. 381/24

4,308,423 12/1981 Cohen ................................. 381/24

4,817,162 3/1989 Kihara ................................. 381/86

FOREIGN PATENT DOCUMENTS 0115000 7/1984 Japan ..................................... 381/24

*Primary Examiner*—Forester W. Isen

*Assistant Examiner*—M. N. McGeary, III.

*Attorney, Agent, or Firm*—Edwin E. Greigg; Ronald E. Greigg

[57] ABSTRACT

A stereophonic reproduction system which improves an unnatural sound image localization at an asymmetric position relative to right and left loudspeakers. Deterioration in tone quality incidental thereto is improved by filters providing right and left channels with selected phase characteristics.

15 Claims, 3 Drawing Sheets

STEREOPHONIC REPRODUCTION SYSTEM

BACKGROUND OF THE INVENTION

This invention relates to a stereophonic reproduction system having right and left channels for reproducing sound sources.

Stereophonic reproduction aims at high-fidelity reproduction of an original sound field, and provides right and left speakers arranged symmetrically with respect to a listening position for realizing a feeling of spread and desired sound image localization.

However, there are occasions on which a listener cannot occupy an equidistant position to the right and left speakers, which is the basic condition for appreciating stereophonic reproduction.

Particularly in an automobile, compared with an ordinary listening room, it is impossible to listen at an equal distance to the right and left speakers because of the limitations to speaker mounting positions and the seat positions. Where, as in this case, the listener stays at a biased position relative to the speaker arrangement, there occurs a phase difference due to a time lag between sound signals resulting from the spatial propagation velocity of sound waves from the speakers to the listening position. Consequently, a state close to antiphase takes place between the two ears of the listener, wherein the sound signals counteract each other at a particular frequency to deteriorate amplitude characteristics and provide a markedly anitphasal, unnatural sound image localization.

To cope with the above inconvenience, correction is made to sound image localization in a limited sound field such as an automobile interior.

Japanese Utility Model Publication Kokai No. 63-49900, for example, discloses a system including a phase shifter in at least one of the signal paths for the right and left channels for varying the phase of a signal in a selected frequency band. Phase compensation is electrically made for the propagation delay of sound signals due to spatial propagation distances from the right and left speakers to a listening position, thereby to compensate for the relative phase difference at the listening position between the sounds from the two speakers.

The principle of the above known sound image localization correcting device will be described hereinafter with reference to the accompanying drawings.

As shown in FIG. 8, a phase shifter having phase characteristics Ph(f), for simplicity of explanation, is provided on one of the signal paths for correcting spatial propagation delays at various frequencies in a frequency band as used. The other signal path allows through-pass.

Assume that, in FIG. 8, the listener is seated on the driver's seat 5R, and that the phase shifter has characteristic Ph(f) which is the function of frequency f, for correcting, over the frequency band, the phase difference of spatial sound propagation time from a left speaker 4L to the driver's seat 5R relative to the spatial sound propagation time from a right speaker 4R to the driver's seat 5R.

Where no correction is made, the phase difference due to the above-mentioned spatial propagation delays will disturb spatial composite frequency characteristics and sound image localization. Especially where the relative phase difference between the right and left speakers is 180 degrees at a particular frequency, the sound signals from the two speakers are canceled for that frequency, thereby disturbing the frequency characteristics.

Where the phase shift 2 having the phase characteristic Ph(f) is mounted on the right signal path, the right speaker 4R reproduces a signal with a delay of Ph(f) electrically set in advance by the phase shift 2, for transmission to the driver's seat. The left speaker 4L reproduces a signal not electrically delayed, which is subjected to the spatial sound propagation delay Ph(f) in the sound field before reaching the driver's seat. As a result, there occurs zero phase difference at the driver's seat between the sounds reproduced from the right and left speakers.

For the passenger seat 5L next to the driver's seat, on the other hand, the left speaker 4L reproduces a signal not electrically delayed. The right speaker 4R reproduces a signal with the delay of Ph(f) electrically set in advance by the phase shift 2, for transmission to the passenger seat. Besides, this signal is subjected to the spatial sound propagation delay Ph(f) in the sound field before reaching the passenger seat. As a result, there occurs a phase difference 2Ph(f) at the passenger seat 5L between the sounds reproduced from the right and left speakers.

The correction value Ph(f) has a maximum value 180 degrees based on what is known as the phase cyclicity. Thus, the relative phase difference at the passenger seat 5L is 360 degrees and, because of the phase cyclicity, the problem of anitphasal, unnatural sound image localization noted hereinbefore.

The above is an explanation of the principle of correction made to the sound image localization at a biased listening position according to the prior art.

However, with the known correcting method as described above, which corrects the phase characteristics by means of the phase shifter having phase characteristics Ph(f) and provided for one of the right and left channels, has the disadvantage of disturbing the harmonic structure at a listening position of spatial composite sound signals of various musical instruments, and greatly deteriorating tone quality.

That is, the spatial sound propagation delay Ph(f) is determined by relation between a difference between distances from the right and left speakers to the listening position, and wavelengths of sound signals in the frequency band used. Its phase characteristics are almost zero in the low frequency range (20 to 100 Hz), zero to 180 degrees in the medium frequency range (100 Hz to 1 KHz) and almost zero in the high frequency range (1 to 20 KHz).

Since a phase shifter having such phase characteristics is mounted on a signal path, those instruments having basic sounds in the low frequency range, for example, have their harmonic components distributed to the medium and high frequency ranges. In the medium frequency range in particular, the phases are shifted to a maximum of 180 degrees. Since the phases of the harmonic components twice or three times the basic sounds are shifted to the maximum of 180 degrees, there occur changes in the structure of sound spectrum of the sound signals, or the formants characteristic of instruments, reproduced from the speakers, thereby deteriorating the tone qualities of various instruments.

Many musical instruments are known to have basic sound components in the low frequency range not exceeding 100 Hz. FIGS. 3(*a*) and (*b*) show the sound spectral distributions of the violin and the bass for reference, FIG. 3(*a*) showing the sound spectral distribution of the former and FIG. 3(*b*) that of the latter. It will be seen that, in the case of the bass, for example, the basic sound is at 300 Hz and most of the tertiary and further harmonic components are distributed in the medium frequency range (100 Hz to 1 KHz).

SUMMARY OF THE INVENTION

The present invention has been made having regard to the state of the art noted above, and its object is to provide an improved stereophonic reproduction system which secures a selected sound image localization in an excellent condition, without deteriorating tone quality, even in a limited sound field such as an automobile interior where it is impossible to listen at an equidistant position to right and left speakers.

In order to achieve the above object, a stereophonic reproduction according to the present invention comprises filters mounted on signal paths of the right and left channels, respectively, for correcting phase characteristics of a sound reproduced through one of the right and left channels by +Ph(f)/2 and phase characteristics of a sound reproduced through the other channel by −Ph(f)/2, where Ph(f) is a function of frequency (f) which is a phase difference over a selected frequency band at a listening position between the two sounds reproduced from a right channel loudspeaker and a left channel loudspeaker occurring when the right and left channels are driven in positive phase for reproducing a sound source.

Filters having the phase characteristics +Ph(f)/2 and −Ph(f)/2 are mounted on the signal paths of the right and left channels, respectively. Therefore, the relative phase difference between the sounds reproduced through the two channels may be made Ph(f) where Ph(f) is a function of frequency (f) which is the phase difference at a listening position between the two sounds reproduced from the right and left loudspeakers occurring when the right and left channels are driven in positive phase. In this way, an excellent sound image localization is secured even where it is impossible to listen to the sounds at a position equidistant to the right and left speakers.

These phase characteristics are provided by allocating a half value of the spatial sound propagation delay Ph(f) to each channel. This allows the phase characteristics of a filter mounted on one channel to be set, for example, to 90 degrees, i.e. half of 180 degrees which is a maximum value of Ph(f). Since the amount of phase shift for the basic sound is halved, it is now possible to reduce the changes in the structure of sound spectrum in the sound field, i.e. the formants characteristic of musical instruments, thereby eliminating deterioration in aurally discernible tone qualities.

Other features and advantages of the present invention will be apparent from the following description.

DETAILED DESCRIPTION OF THE PREFERRED EMBODIMENT

Figure 1:
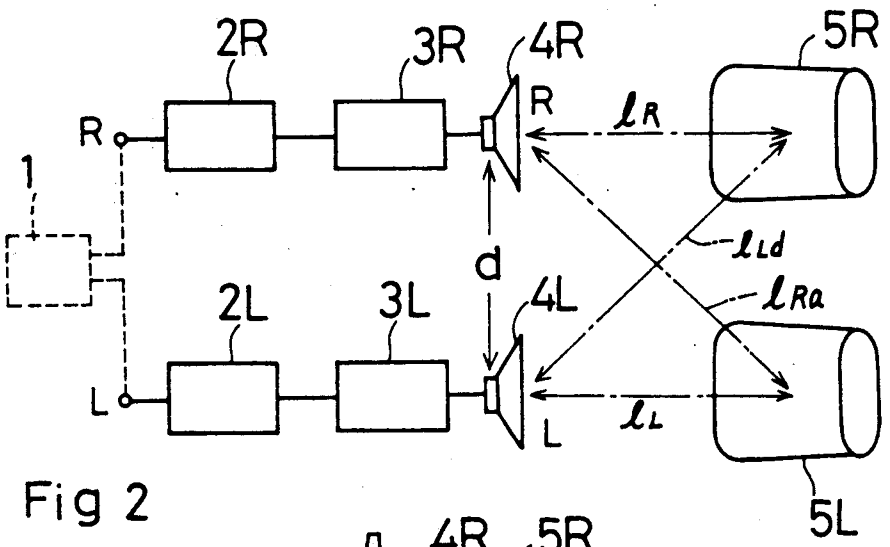
FIGS. 1 and 2 are views showing an embodiment of the present invention.
Figure 2:
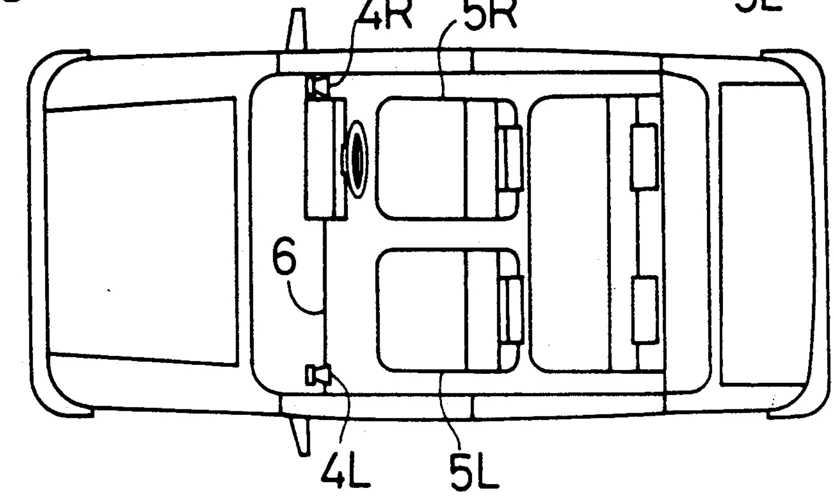
Figure 3A:
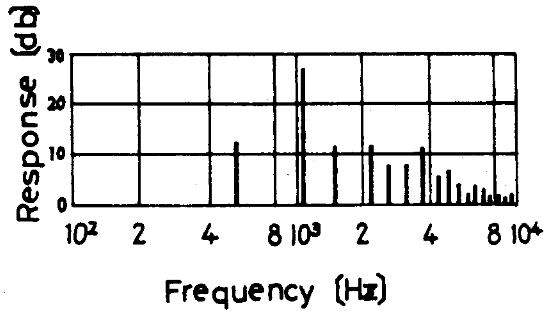
FIGS. 3(*a*) and (*b*) are views showing sound spectral distributions of the violin and the bass, respectively.
Figure 3B:
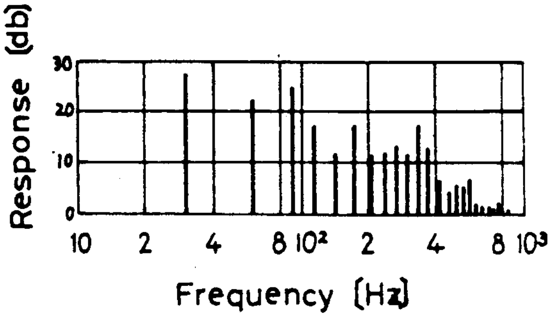

FIG. 1 is a diagram schematically showing an embodiment of the present invention. FIG. 2 is a schematic view of a stereophonic reproduction system installed in an automobile. In FIG. 2, the reproduction system includes a right speaker 4R and a left speaker 4L fitted in a dashboard 6 as opposed to a driver's seat 5R and a passenger seat 5L, respectively.

Referring to FIG. 1, a left channel signal output from a sound source 1 is applied to a filter 2L and, after its phase is advanced a predetermined amount, amplified by an amplifier 3L as appropriate, and output as a sound signal from the speaker 4L. A right channel signal output from the sound source 1 is applied to a filter 2R and, after its phase is delayed a predetermined amount, amplified by an amplifier 3R as appropriate, and output as a sound signal from the speaker 4R.

In FIG. 1, the right and left speakers are spaced from each other by a distance d, the driver's seat 5R is spaced from the right speaker 4R by a distance $l_R$, the passenger seat 5L is spaced from the right speaker 4R by a distance $l_{Ra}$, the passenger seat 5L is spaced from the left speaker 4L by a distance $l_L$, the driver's seat 5R is spaced from the left speaker 4L by a distance $l_{Ld}$, and the frequency is f. Assume that a listener is seated in the driver's seat 5R. A delay due to a path difference $\Delta l = l_{Ld} - l_R$ from the right and left speakers is:

$$\tau = \Delta l / C = (l_{Ld} - l_R)/C \quad (1)$$

where C is the sound speed. Assuming that the sound reproduced from the right speaker is A=a sin wt, the sound reproduced from the left speaker is:

$$B = a \sin \omega(t - \tau) \quad (2)$$

Phase difference $\Delta\theta$ between the two reproduced sounds is expressed in the following equation:

$$\Delta\theta = 2\pi \cdot \tau \cdot f \text{ [rad]} \quad (3)$$

The two reproduced sounds cancel each other if $\Delta\theta = \pi(2n+1)$, where n is an integer. On the other hand, the two sounds combine if $$\Delta\theta = 2\pi(2n+1)$$

Accordingly, frequency fd for producing the cancellation is:

$$fd = (2n+1)/2 \cdot \tau$$

Frequency fp for producing the combination is:

$$fp = (2n+1)/\tau$$

In a first mode (n=0)

$$fd = \frac{1}{2 \cdot \tau}, \quad fp = \frac{1}{\tau} \tag{4}$$

Based on the equation (3), the phase difference at the listening position between the right and left speaker may be set as a function of frequency f:

$$\Delta\theta = 2\pi \cdot \tau \cdot f = Ph(f) \text{ [rad]} \tag{3}$$

The filter mounted on the right channel signal path has phase characteristics −Ph(f)/2, while the filter mounted on the left channel signal path has phase characteristics +Ph(f)/2 (+ signifies advance, and − delay). Therefore, by the principle noted hereinbefore, there occurs no relative phase difference at the listening position due to the spatial propagation lag between the sounds from the right and left speakers, and the two sound signals are combined. Similarly, at the passenger seat, the relative phase difference becomes 2 [rad], and the two sound signals are combined by virtue of the phase cyclicity. Thus, a desired sound image localization is secured at both the driver's seat and passenger seat.

When the above is applied to an actual automobile situation with $l_R$=50 cm, d=180 cm and $l_{Ld}$=227.6 cm, then fd=149 Hz and fp=299 Hz.

Thus, the filters may be designed to have phase characteristics to provide 90 degrees phase advance/delay between fd and fp. In practice, the phase is mostly reversed between 200 Hz and 2 KHz under the influence of multiple reflected sounds close to one another inside an automobile or the like. It is therefore desirable to determine its range based on actually measured phase characteristics.

Figure 4:
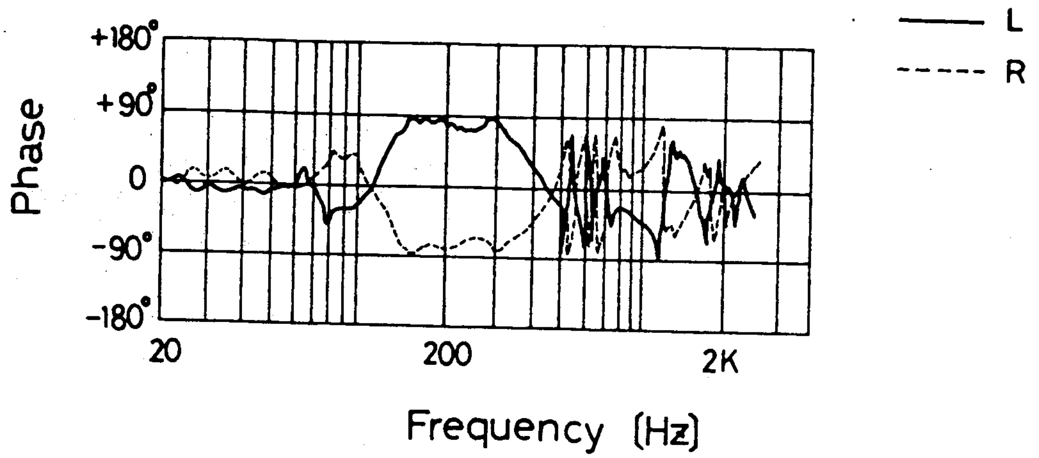
FIG. 4 is a view showing filter phase characteristics of the embodiment of the invention.

FIG. 4 shows phase characteristics of the filters in this embodiment. The solid line represents the characteristics of the filter for the left channel, and the dotted line those of the filter for the right channel. The phase characteristics shown in FIG. 4 were derived from FIR (Finite Impulse Response) digital filters. The sampling frequency was 44.1 KHz, with 1024 taps. The FIR digital filters 2L and 2R have constant amplitude-frequency characteristics through all bands, and impulse response coefficient set so that the phase characteristics be Ph(f).

Alternatively, the FIR digital filters may amplitude-frequency characteristics for reinforcing the low range or impulse response set for the characteristics to follow the equal loudness contour of Fletcher-Munson. Then not only the phase correction but frequency characteristics correction may be made at the same time.

The FIR digital filters 2L and 2R have a phase transition band from about 80 Hz to 1.3 KHz. This is because there is little right and left phase difference in the band below 80 Hz, and there occurs intense phase rotation of the two channels reducing the phase transition effect in the band above 1.3 KHz.

Although in the above embodiment the phase correction is effected to the limited band, the correction may of course be effected to all bands.

The object of the present invention may also be achieved where the phase characteristics of the filters are such that, in the frequency band between 200 Hz and 1 KHz, the phase of the output signal from one of the right and left channels is advanced 60 to 90 degrees with respect to an input signal, and the output signal from the other channel delayed 60 to 90 degrees with respect to the input signal, thereby setting the phase difference between the two output signals to 120 to 180 degrees.

The filters having the above phase characteristics may comprise active filters using operational amplifiers. The entire system may be constructed at low cost by employing filters comprising such analog circuits.

Figure 5:
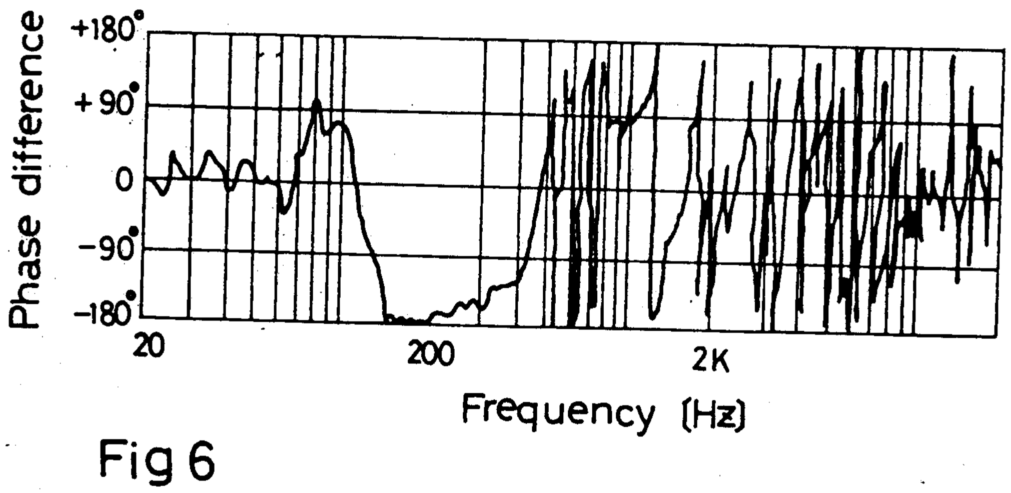
FIG. 5 is a view showing test data of phase characteristics before correction.

FIG. 5 is test data showing the phase characteristics, in which a phase difference is obtained at the driver's seat prior to correction between the sounds reproduced from the right and left speakers of the stereophonic reproduction system installed in an automobile. It is clearly shown that an antiphase takes place in the medium band (100 Hz to 1 KHz).

Figure 6:
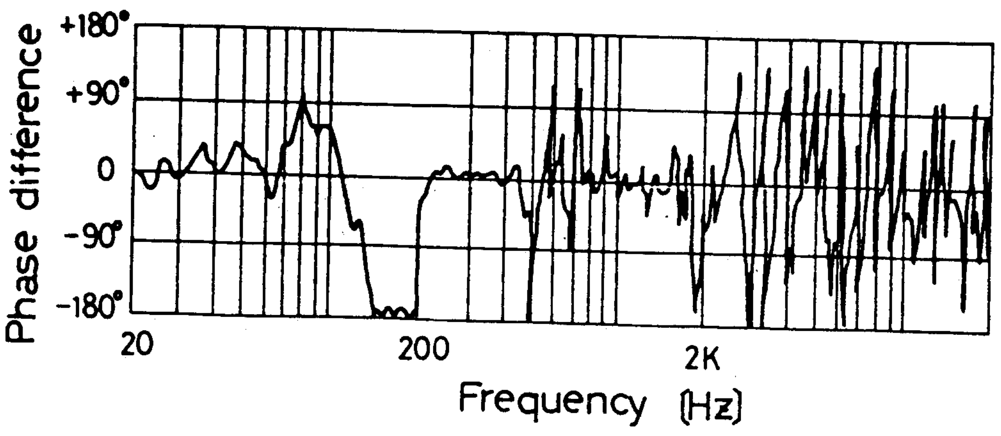
FIG. 6 is a view showing test data of phase characteristics after correction.

FIG. 6 is test data showing the phase characteristics, in which a phase difference is obtained at the driver's seat after the correction between the sounds reproduced from the right and left speakers in this embodiment. It will be seen that the correction is made to produce zero relative phase difference.

Figure 7:
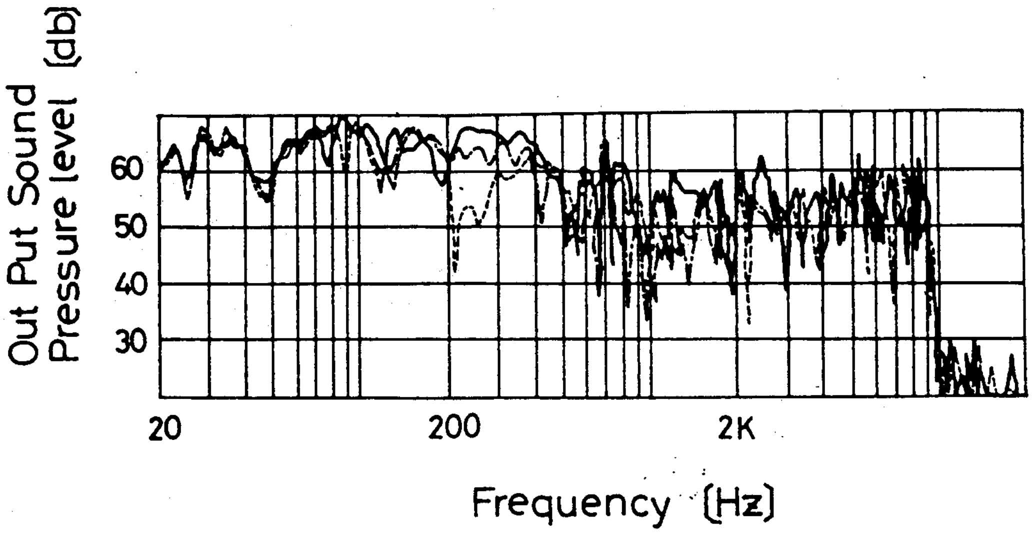
FIG. 7 is a view showing test data of amplitude-frequency characteristics before and after correction.
Figure 8:
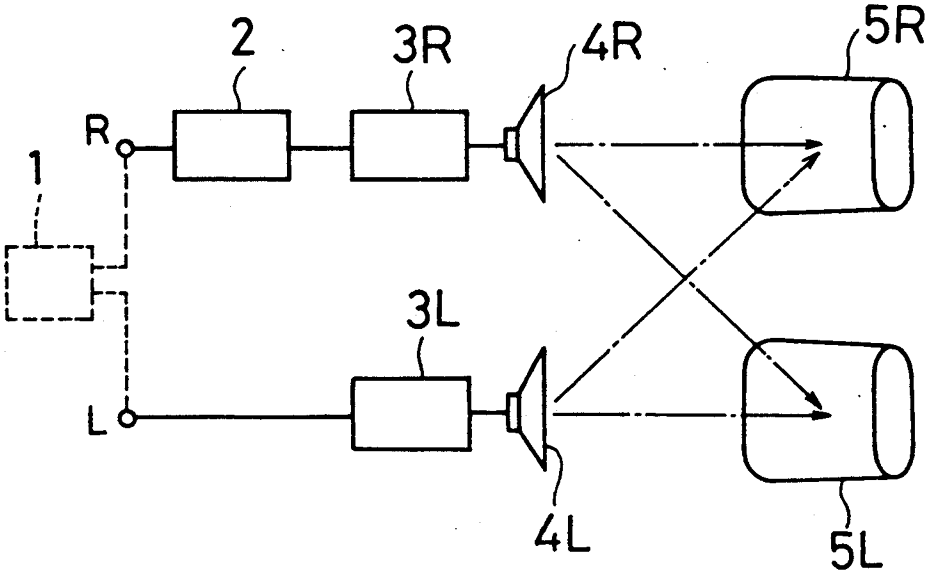
Fig 8 (PRIOR ART)
FIG. 8 is an explanatory view of a known stereophonic reproduction system.

FIG. 7 is test data showing amplitude-frequency characteristics obtained at the respective seat positions before and after the correction. The solid line represents the characteristics obtained at the driver's seat after the correction, the dot and dash line those obtained at the passenger seat after the correction, and the broken line those obtained at the driver's seat before the correction. It will be seen from these results that the correction made through the foregoing filters is effective to decrease amplitude attenuation due to cancellation of the right and left sound signals based on the phase difference, and that the amplitude characteristics in the medium band (100 Hz to 1 KHz) have been improved. The reason for the amplitude characteristics varying through all bands is that, aside from direct sounds, reflected sounds have great influences in an automobile interior.

As an alternative to the foregoing embodiment of the present invention, frequency characteristics control devices may be provided, in place of the digital filters having the described phase characteristics, at selected positions of the right and left channels for compensating for the frequency characteristics of the reproduced sounds. These frequency characteristics control devices may comprise graphic equalizers having a known construction, or equivalent devices.

What is claimed is:

1. A stereophonic reproduction system having right and left channels for reproducing a sound source, comprising filters mounted on signal paths of said right and left channels, respectively, for correcting phase characteristics of a sound reproduced through one of said right and left channels by +Ph(f)/2 and phase characteristics of a sound reproduced through the other channel by −Ph(f)/2, where Ph(f) is a function of frequency (f) which is a non-zero phase difference over a selected frequency band at a listening position between the two sounds reproduced from a right channel loudspeaker and a left channel loudspeaker occurring when the right and left channels are driven in positive phase.

2. A stereophonic reproduction system as claimed in claim 1, wherein the phase difference Ph(f) between the two reproduced sounds is 120 to 180 degrees.

3. A stereophonic reproduction system as claimed in claim 1, wherein frequency characteristics control means is provided to compensate for the frequency characteristics of the reproduced sounds with respect to frequency characteristics of the sound source.

4. A stereophonic reproduction system as claimed in claim 1, wherein said filters comprise digital filters.

5. A stereophonic reproduction system as claimed in claim 1, which is suited for installation in a vehicle.

6. A stereophonic reproduction system as claimed in claim 2, wherein frequency characteristics control means is provided to compensate for the frequency characteristics of the reproduced sounds with respect to frequency characteristics of the sound source.

7. A stereophonic reproduction system as claimed in claim 2, wherein said filters comprise digital filters.

8. A stereophonic reproduction system as claimed in claim 3, wherein said filters comprise digital filters.

9. A stereophonic reproduction system as claimed in claim 2, which is suited for installation in a vehicle.

10. A stereophonic reproduction system as claimed in claim 3, which is suited for installation in a vehicle.

11. A stereophonic reproduction system as claimed in claim 4, which is suited for installation in a vehicle.

12. A stereophonic reproduction system as claimed in claim 5, which is suited for installation in a vehicle.

13. A stereophonic reproduction system as claimed in claim 6, which is suited for installation in a vehicle.

14. A stereophonic reproduction system as claimed in claim 7, which is suited for installation in a vehicle.

15. A stereophonic reproduction system as claimed in claim 8, which is suited for installation in a vehicle.

* * * * *